(12) United States Patent
Watari et al.

(10) Patent No.: US 7,819,032 B2
(45) Date of Patent: Oct. 26, 2010

(54) TESTING TOOL FOR ELECTRIC BICYCLE DEVICES

(75) Inventors: Etsuyoshi Watari, Sakai (JP); Kazuhiro Takeda, Sakai (JP); Haruyuki Takebayashi, Sakai (JP)

(73) Assignee: Shimano Inc., Osaka (JP)

( * ) Notice: Subject to any disclaimer, the term of this patent is extended or adjusted under 35 U.S.C. 154(b) by 1030 days.

(21) Appl. No.: 11/589,793

(22) Filed: Oct. 31, 2006

(65) Prior Publication Data

US 2008/0154531 A1    Jun. 26, 2008

(51) Int. Cl.
G01M 19/00    (2006.01)
(52) U.S. Cl. ..................................... 73/865.9
(58) Field of Classification Search ............... 73/865.8, 73/865.9
See application file for complete search history.

(56) References Cited

U.S. PATENT DOCUMENTS

| | | | | |
|---|---|---|---|---|
| 5,213,548 A | * | 5/1993 | Colbert et al. | 474/71 |
| 5,481,901 A | * | 1/1996 | Huang | 73/1.41 |
| 6,799,106 B2 | | 9/2004 | Fukushima et al. | |
| 7,085,680 B2 | | 8/2006 | Huang | |
| 2005/0275978 A1 | * | 12/2005 | Kitamura | 361/20 |
| 2006/0047372 A1 | * | 3/2006 | Uno | 701/1 |

FOREIGN PATENT DOCUMENTS

| | | |
|---|---|---|
| DE | 20 2004 002 699 U1 | 5/2004 |
| EP | 0 820 923 A1 | 1/1998 |
| EP | 1 211 755 A2 | 6/2002 |
| EP | 1 295 786 A2 | 3/2003 |
| EP | 1 693 292 A1 | 8/2006 |
| FR | 2 865 994 A1 | 8/2005 |
| JP | H05-040707 | 2/1993 |
| JP | H06-244811 | 9/1994 |
| JP | 2000-188575 | 7/2000 |

* cited by examiner

*Primary Examiner*—Hezron Williams
*Assistant Examiner*—Nashmiya Fayyaz
(74) *Attorney, Agent, or Firm*—Global IP Counselors, LLP

(57) ABSTRACT

A testing tool for electric bicycle devices includes a tester circuit and a connector. The tester circuit is configured and arranged to test and diagnose operability of at least one electric bicycle device. The connector extends from the tester circuit and is configured and arranged to connect to the electric bicycle device and provide electronic communications between the tester circuit and the electric bicycle device.

17 Claims, 7 Drawing Sheets

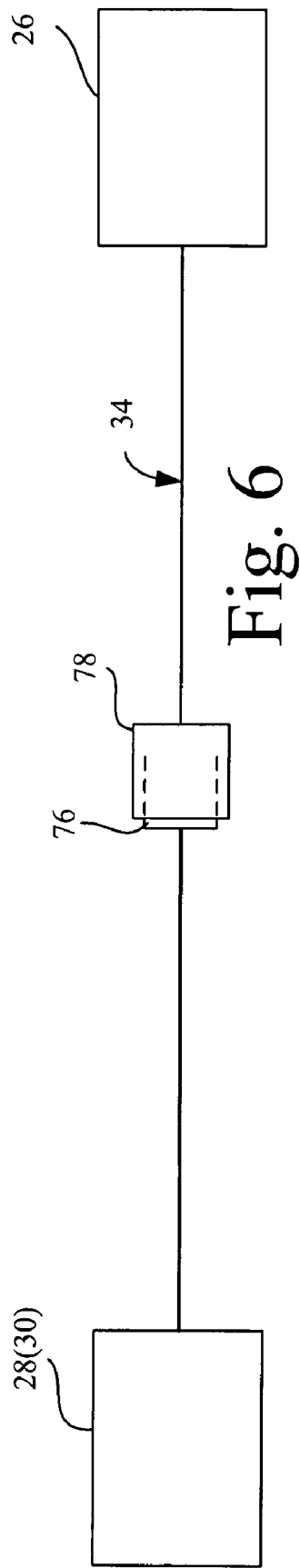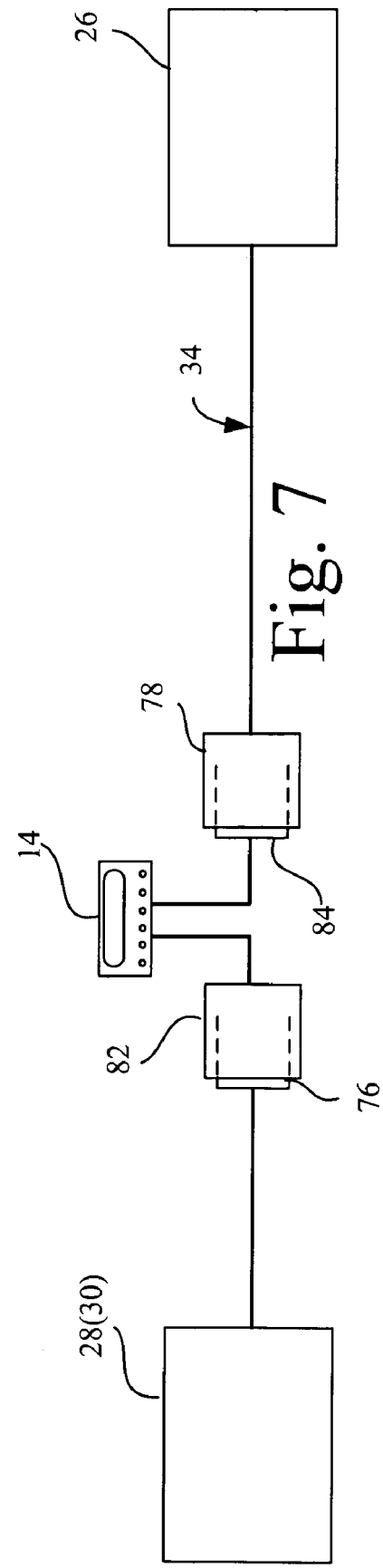

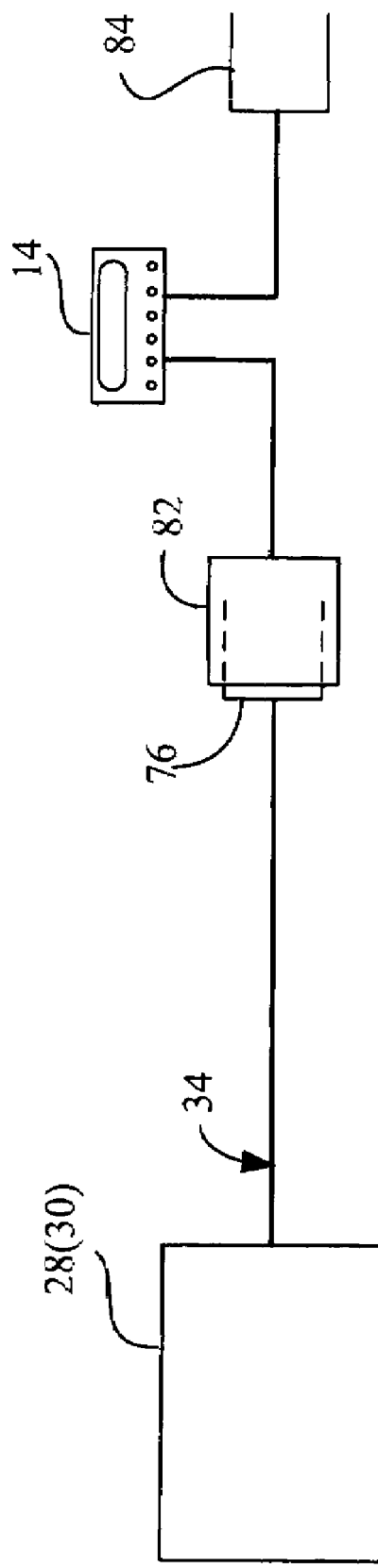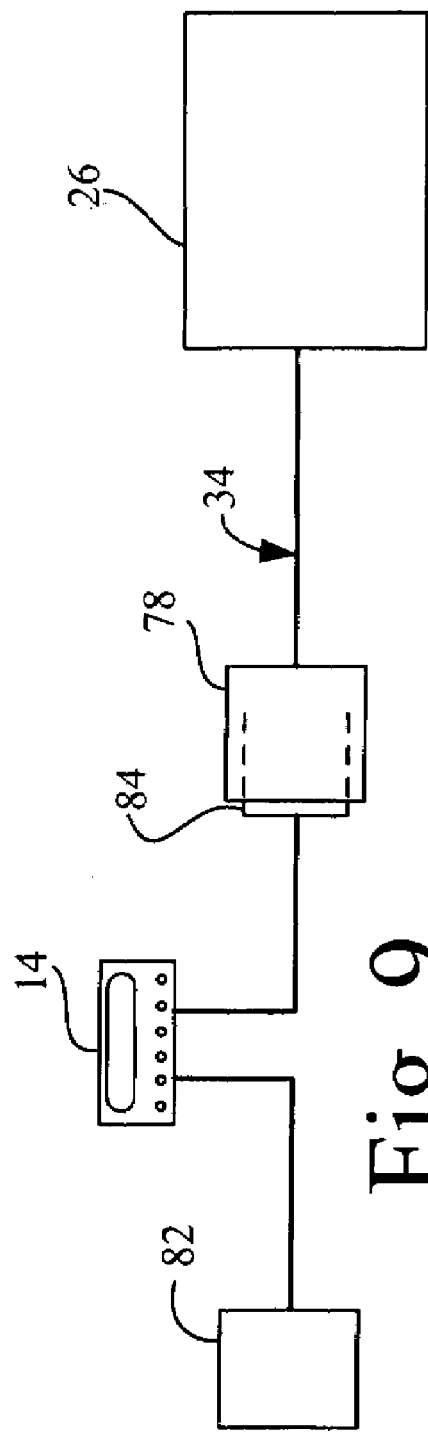

TESTING TOOL FOR ELECTRIC BICYCLE DEVICES

BACKGROUND OF THE INVENTION

1. Field of the Invention

This invention generally relates to a testing tool for electric bicycle devices. More specifically, the present invention relates to a testing tool for electric bicycle devices that electrically tests operability of electric bicycle devices.

2. Background Information

Bicycling is becoming an increasingly more popular form of recreation as well as a means of transportation. Moreover, bicycling has become a very popular competitive sport for both amateurs and professionals. Whether the bicycle is used for recreation, transportation or competition, the bicycle industry is constantly improving the various components of the bicycle. One component that has been extensively redesigned is the bicycle shift system.

Recently bicycle shift systems have been redesigned to include electrically powered components. Specifically, electrically powered shift systems now include electric powered front derailleurs, electric powered rear derailleurs and electric shift operating devices. The electric shift operating device includes a lever or buttons that are manipulated by a cyclist. Manipulation of the lever or buttons causes the electric shift operating device to transmit electric signal patterns to the electric front and rear derailleurs. The electric signal patterns sent to the electric front and rear derailleurs cause the electric front and rear derailleurs to move the bicycle chain to a predetermined location corresponding to a chainring, thus changing the pedaling speed.

In the field, in order to diagnose operability of a any one of the electric front and rear derailleurs and the electric shift operating device, one by one each of the electric front and rear derailleurs and the electric shift operating device must be replaced to determine the broken or faulty device.

In view of the above, it will be apparent to those skilled in the art from this disclosure that there exists a need for an improved means for diagnosing electric bicycle devices that do not require replacement of the electric front and rear derailleurs and the electric shift operating device. This invention addresses this need in the art as well as other needs, which will become apparent to those skilled in the art from this disclosure.

SUMMARY OF THE INVENTION

One object of the present invention is to provide a simple method for testing and diagnosing components of an electric bicycle device.

Another object of the present invention is to provide a simple device for testing and diagnosing components of an electric bicycle device.

The foregoing objects can basically be attained by providing a testing tool for electric bicycle devices with a tester circuit and a connector. The tester circuit is configured and arranged to test and diagnose operability of at least one electric bicycle device. The connector extends from the tester circuit and is configured and arranged to connect to the electric bicycle device and provide electronic communications between the tester circuit and the electric bicycle device.

These and other objects, features, aspects and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 6 is a schematic drawing showing the connectors of the wiring harness of the electric bicycle device connected to one another in accordance with the present invention;

FIG. 7 is a schematic drawing showing the connectors of the wiring harness of the electric bicycle device disconnected from one another and with the testing tool connected thereto in accordance with a first embodiment of the present invention;

FIG. 8 is schematic drawing showing one of the components of the electric bicycle device connected to the testing tool in accordance with a second embodiment of the present invention;

FIG. 9 is schematic drawing showing another one of the components of the electric bicycle device connected to the testing tool in accordance with the second embodiment the present invention;

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Figure 1:
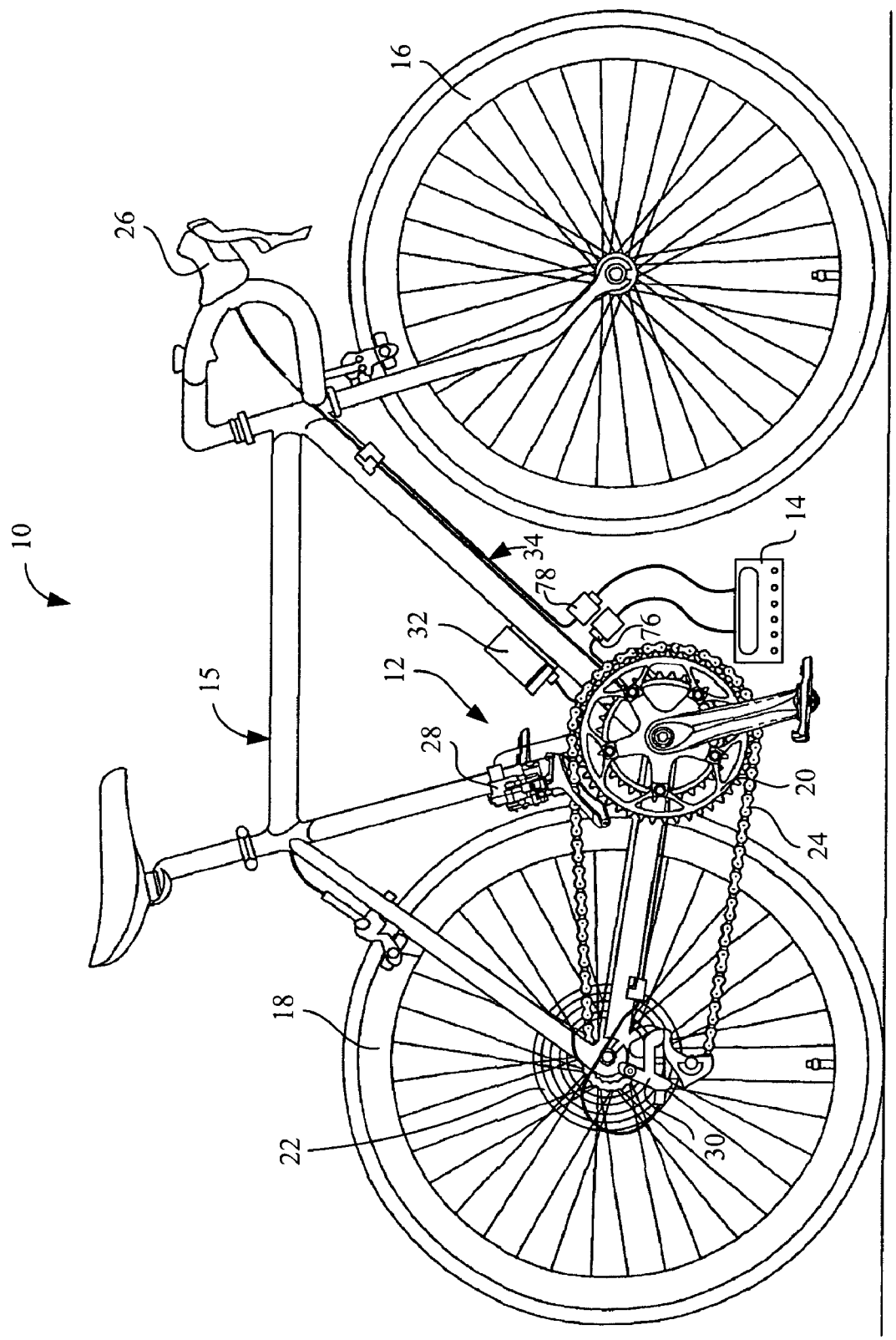
FIG. 1 is a side elevational view of a bicycle that includes a electric bicycle device, showing a testing tool connected to the electric bicycle device in accordance with the present invention.
Figure 2:
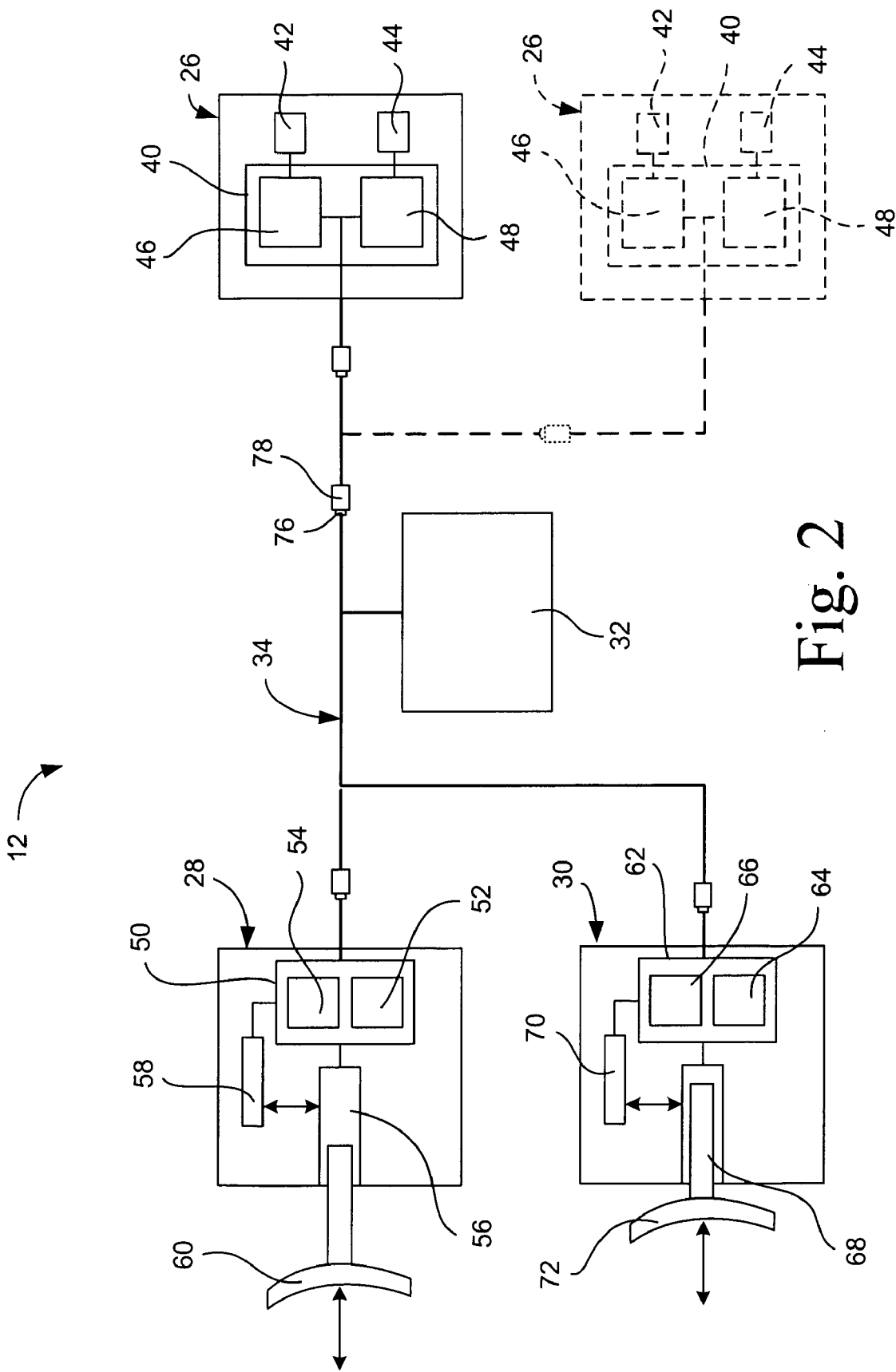
FIG. 2 is a schematic drawing showing various components of the electric bicycle device in accordance with the present invention.

Referring initially to FIGS. 1 and 2, a bicycle 10 having an electrically powered shift system 12 connected to a testing tool 14 is illustrated in accordance with a first embodiment of the present invention. The testing tool 14 is configured to connect to electrically powered components of the electrically powered shift system 12 of the bicycle 10 and test those components in order to determine operability of those components. The testing tool 14 and its operation are described in greater detail below.

In order to understand the function and operation of the testing tool 14, a description of selected portions of the bicycle 10 and the electrically powered shift system 12 is first provided.

With specific reference to FIG. 1, the bicycle 10 basically includes (among other things) a frame 15, a front wheel 16, a rear wheel 18, a front chainring set 20, a rear sprocket cassette 22, a chain 24 and the electrically powered shift system 12 (which includes electric bicycle devices).

The front wheel 16 and the rear wheel 18 are supported on the frame 15 in a conventional manner. The front chainring set 20 is rotatably mounted to the frame 15. The rear sprocket cassette 22 is coupled to a hub (not shown) of the rear wheel 18 in a conventional manner. The chain 24 wraps part way around one of the chainrings in the front chainring set 20 and one of the chainrings of the rear sprocket cassette 22. The various diameters of the chainrings of the front chainring set 20 and the rear sprocket cassette 22 define a plurality of gear ratios in a conventional matter. Movement of the chain 24 between the various chainrings of the front chainring set 20 and the rear sprocket cassette 22 changes the gear ratio between rotation of the front chainring set 20 and rotation of the rear wheel 18.

As indicated schematically in FIG. 2, the electrically powered shift system 12 basically includes at least one shift device 26, a front derailleur 28, a rear derailleur 30, a battery 32 and a wiring harness 34. The shift device 26, the front derailleur 28, the rear derailleur 30, the battery 32 and the wiring harness 34 are also shown in FIG. 1. The shift device 26, the front derailleur 28 and the rear derailleur 30 are all electric bicycle devices. The shift device 26, the front derailleur 28 and the rear derailleur 30 are also components of the electrically powered shift system 12 that can be tested and diagnosed by the testing tool 14 of the present invention.

Referring now to FIG. 2, the shift device 26 is an electric shift operating device that includes a microcomputer 40, an up-shift select portion 42, a down-shift select portion 44, a signal transmitting portion 46 and a signal receiving portion 48. The up-shift select portion 42, the down-shift select portion 44, the signal transmitting portion 46 and the signal receiving portion 48 are all electronically connected to the microcomputer 40.

The microcomputer 40 is configured to process signals from the up-shift select portion 42, the down-shift select portion 44 and the signal receiving portion 48. The microcomputer 40 is also configured to transmit predetermined signals or signal patterns to the front derailleur 28 and the rear derailleur 30 via the signal transmitting portion 46, as described below.

The up-shift select portion 42 and the down-shift select portion 44 are cyclist input portions that respond to actions by a cyclist riding the bicycle 10. For instance, the shift device 26 can include either a lever (not shown) or buttons (not shown) operably coupled to the up-shift select portion 42 and the down-shift select portion 44. If the cyclist pushes the lever or presses the button corresponding to movement of the chain 24 to an increased gear ratio, a corresponding signal is sent from the up-shift select portion 42 to the microcomputer 40. Similarly, if the cyclist pushes the lever or button corresponding to movement of the chain 24 to a reduced gear ratio, a corresponding signal is sent from the down-shift select portion 44 to the microcomputer 40.

The signal transmitting portion 46 is configured to send signals to one or both of the front derailleur 28 and the rear derailleur 30. The signals transmitted by the signal transmitting portion 46 include, for example, instructions to change the location of the chain 24 on a respective one (or both) of the front chainring set 20 and the rear sprocket cassette 22. The appropriate signal transmitted by the signal transmitting portion 46 is determined by the microcomputer 40. The signal receiving portion 48 is configured to receive position signals transmitted from the front and rear derailleurs 28 and 30 corresponding to the current position of the chain 24 relative to the front chainring set 20 and the rear sprocket cassette 22.

It should be understood from the description herein that the bicycle 10 can be provided with a single one of the shift device 26 that controls chain movement (shifting actions) of both the front and rear derailleurs 28 and 30. Alternatively as indicated in phantom in FIG. 2, the bicycle 10 can be provided with two of the shift devices 26, one controlling the front derailleur 28 and the other controlling the rear derailleur 30. Correspondingly, the testing tool 14 can be configured to test a system with one shift device 26 or a system with two of the shift devices 26.

The front derailleur 28 includes (among other things) a microcomputer 50, a signal receiving portion 52, a signal transmitting portion 54, a motor control unit 56, a position sensor 58 and a chain guide 60. The signal receiving portion 52, the signal transmitting portion 54, the motor control unit 56 and the position sensor 58 are all electronically connected to the microcomputer 40. The chain guide 60 is mechanically coupled to the motor control unit 56 such that operation of the motor control unit 56 causes corresponding movement of the chain guide 60 and the chain 24.

The microcomputer 50 is configured to process signals from the signal receiving portion 52 and the position sensor 58. The signal receiving portion 52 is configured to receive signals from the shift device 26 corresponding to user selected movements of the chain 24. Signals received by the signal receiving portion 52 are provided to the microcomputer 50 for processing. The signal transmitting portion 54 is configured to transmit signals to the shift device 26. Examples of such signals include a chain guide position signal corresponding to output from the position sensor 58 and the current location of the chain 24 relative to the front chainring set 20.

The motor control unit 56 is preferably an electric motor operably connected to the chain guide 60. The motor control unit 56 can be either a linear or rotary stepper motor or similar device that provides appropriate positioning control. Specifically, the motor control unit 56 is configured to respond to signals from the microcomputer 50 to position the chain guide 60 at desired locations relative to the front chainring set 20.

The position sensor 58 is configured to monitor the relative position of the motor control unit 56 and/or the chain guide 60. Calibrated signals from the position sensor 58 are received and processed by the microcomputer 40 such that the microcomputer 40 determines which chainring sprocket of the front chainring set 20 the chain 24 is engaged with.

The rear derailleur 30 includes (among other things) a microcomputer 62, a signal receiving portion 64, a signal transmitting portion 66, a motor control unit 68, a position sensor 70 and a chain guide 72. The signal receiving portion 64, the signal transmitting portion 66, the motor control unit 68 and the position sensor 70 are all electronically connected to the microcomputer 62. The chain guide 72 is mechanically coupled to the motor control unit 68 such that operation of the motor control unit 68 causes corresponding movement of the chain guide 72 and the chain 24.

The microcomputer 62 is configured to process signals from the signal receiving portion 64 and the position sensor 70. The signal receiving portion 64 is configured to receive signals from the shift device 26, such as the speed increasing chain movement signal and the speed decreasing chain movement signal. Signals received by the signal receiving portion 64 are provided to the microcomputer 62 for processing. The signal transmitting portion 66 is configured to transmit signals to the shift device 26. Examples of such signals include a chain guide position signal corresponding to output from the position sensor 70 and the current position of the chain 24 relative to the rear sprocket cassette 22.

The motor control unit 68 is preferably an electric motor operably connected to the chain guide 72. The motor control unit 68 can be either a linear or rotary stepper motor or similar device that provides appropriate positioning control. Specifically, the motor control unit 68 is configured to respond to signals from the microcomputer 62 to move the chain guide 72 to locations corresponding to individual chainrings of the rear sprocket cassette 22.

The position sensor 70 is configured to monitor the position of the motor control unit 68 and/or the chain guide 72. Signals from the position sensor 70 are received and processed by the microcomputer 52 such that the microcomputer 52 determines which chainring sprocket of the front chainring set 20 the chain 24 is engaged with.

The battery 32 is mounted to the frame 15 of the bicycle 10. The battery 32 supplies power to the front and rear derailleurs 28 and 30 via the wiring harness 34. The wiring harness 34 includes a plurality of independent wires that provide a plurality of electrical connections between the shift device 26, the front derailleur 28, the rear derailleur 30 and the battery 32. The wiring harness 34 also includes a plurality of connectors that allow for easy connection and disconnection from the shift device 26, the front derailleur 28, the rear derailleur 30 and the battery 32.

Figure 4:
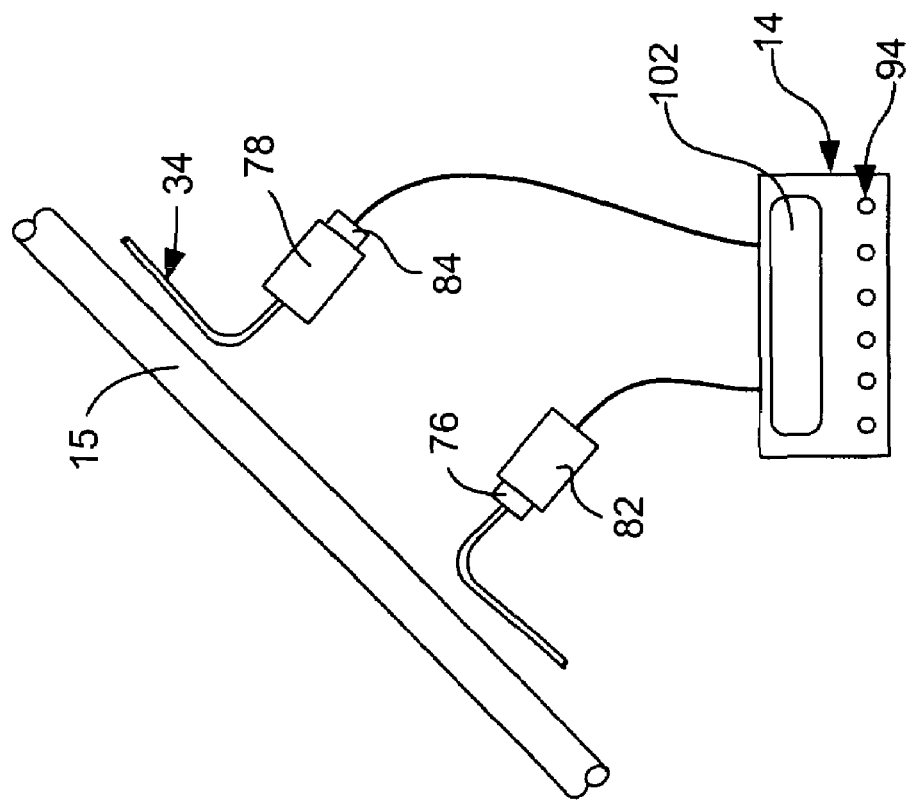
FIG. 4 is a fragmentary side view of a portion of the bicycle shown in FIG. 3, showing the connectors of the wiring harness of the electric bicycle device disconnected from one another with the testing tool connected in accordance with the present invention.
Figure 3:
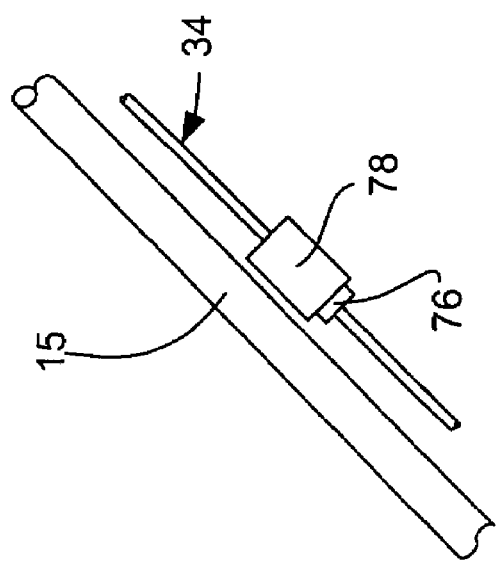
FIG. 3 is a fragmentary side view of a portion of the bicycle showing connectors of a wiring harness of the electric bicycle device in accordance with the present invention.

For the sake of simplicity, two mating connectors 76 and 78 are shown in FIGS. 1, 3 and 4 at an underside of frame 15. The connector 76 is a male connector and the connector 78 is a female connector. The connector 76 and the connector 78 can include any of a variety of mating connector configurations that are easily disconnected from one another. Further, the connectors 76 and 78 can also be provided at various locations along the wiring harness 34, such as at the shift device 26. Further, a plurality of sets of the connectors 76 and 78 can be provided with the wiring harness 34, where the specific location of the connectors 76 and 78 in the wiring harness 34 is variable. The connectors 76 and 78 can be positioned in any of a variety of locations along the various branches and portions of the wiring harness 34, and thus are not limited to the location depicted in FIGS. 1, 3 and 4.

It should be understood from the drawings and the description herein that the components of the electrically powered shift system 12 described above, are only examples of such components. The present invention is not limited to testing and diagnosing components such as the specific ones of the shift device 26, the front derailleur 28 and the rear derailleur 30 described above. Rather, the testing tool 14 is configured to test and diagnose any of a variety of such components including those that may have fewer or a greater number of features and elements. Further, the testing tool 14 can be used to test and diagnose any such components of an electrically powered shift system that includes electrically controllable elements, sensors and related features.

Figure 5:
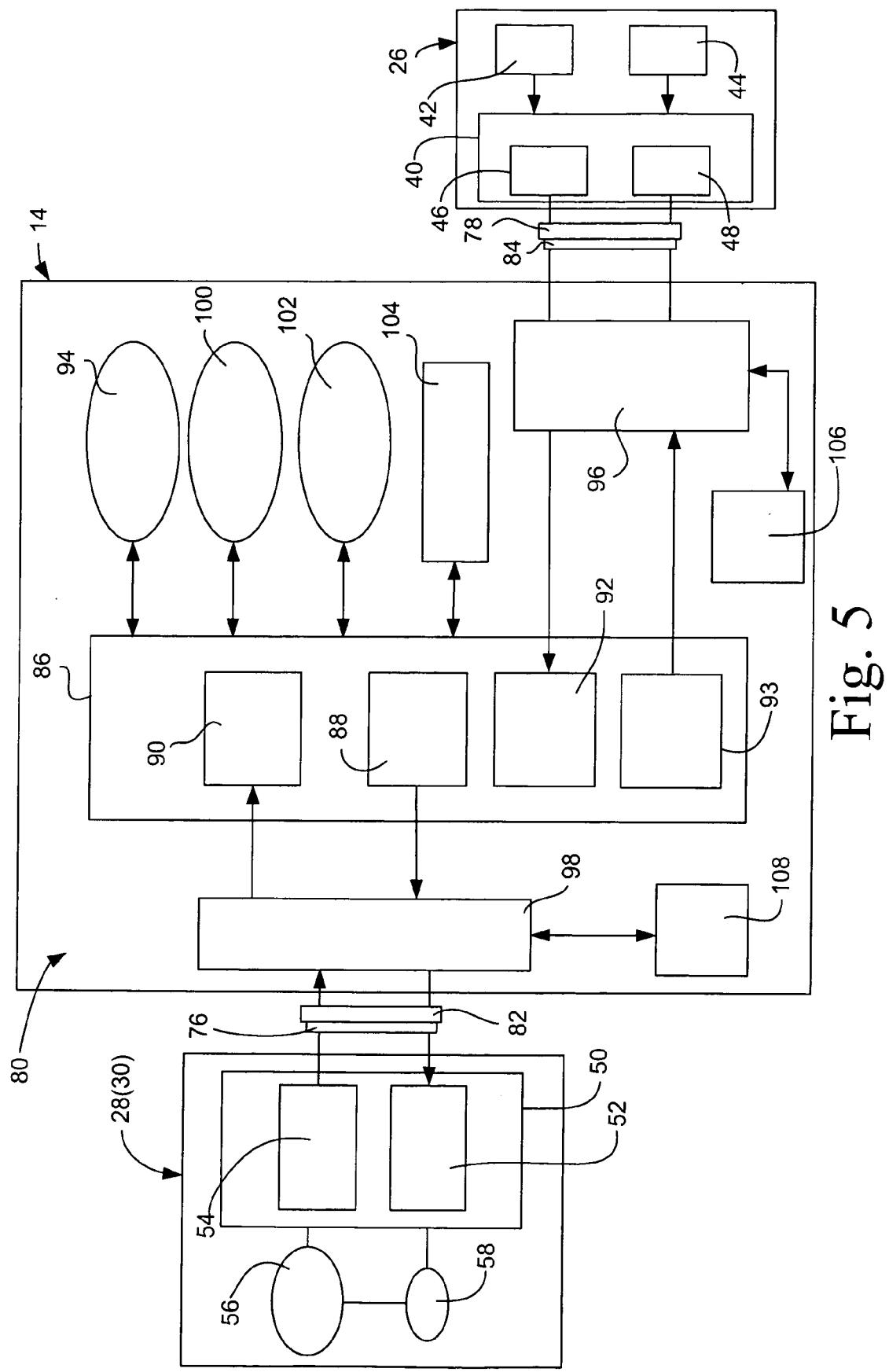
FIG. 5 is a schematic drawing showing various elements and portions of the electric bicycle device and the testing tool in accordance with the present invention.

A description of the testing tool 14 is now provided with respect to FIG. 5. The testing tool 14 basically includes a tester circuit 80 that is configured and arranged to test and diagnose operability of at least one component of the electric bicycle device 12, such as the shift device 26, the front derailleur 28 and the rear derailleur 30. The testing tool 14 also includes connectors 82 and 84 that extend from the tester circuit 80. The connectors 82 and 84 are configured and arranged to connect to a plurality of the components of the electric bicycle device 12 and provide electronic communications between the tester circuit 80 and the components of the electric bicycle device 12. The testing tool 14 also includes a battery (not shown) that supplies power to the tester circuit 80.

The tester circuit 80 of the testing tool 14 includes a microcomputer 86, a signal transmitting portion 88, a first signal receiving portion 90, a second signal receiving portion 92, a second signal transmitting portion 93, a switch mechanism 94, a first voltage level conversion circuit 96, a second voltage level conversion circuit 98, an audible indication portion 100 and a visual indication portion 102.

The connector 82 is configured to connect to the connector 76 of the wiring harness 34. The connector 84 is configured to connect to the connector 78 of the wiring harness 34. However, it should be understood from the drawings and the description herein that the connector 82 can also be directly connected to either of the front derailleur 28 and the rear derailleur 30. Further, the connector 84 can also be directly connected to the shifter device 26.

The signal transmitting portion 88, the first signal receiving portion 90, the second signal receiving portion 92, the second signal transmitting portion 93, the switch mechanism 94, the audible indication portion 100 and the visual indication portion 102 are all operably connected to the microcomputer 86.

The microcomputer 86 includes memory 104 that is configured to store a variety of signal patterns corresponding to the signals and signal patterns sent and received by components of electric bicycle device 12, such as the shift device 26, the front derailleur 28 and the rear derailleur 30. The memory 104 can also store computer code corresponding to computer code stored or programmed into each of the shift device 26, the front derailleur 28 and the rear derailleur 30.

It should be understood from the description and drawings herein that the memory 104 can store groups of differing signal patterns and/or computer code corresponding to a variety of models and configurations of shift devices, derailleurs and similar components of electrically powered shift systems. Specifically, the testing tool 14 can be programmed and configured to communicate with and diagnose operating conditions of any of a variety of electric shift devices and electric chain positioning devices.

The signal transmitting portion 88 is configured to transmit signals to the signal receiving portion 52 of the front derailleur 28 (and the signal receiving portion 64 of the rear derailleur 30). For example, the signal transmitting portion 88 is configured to send one or more shift signals to the front derailleur 28 (and/or the rear derailleur 30) to simulate shift signals transmitted by the shift device 26.

The first signal receiving portion 90 is configured to receive signals from the signal transmitting portion 54 of the front derailleur 28 (and the signal transmitting portion 66 of the rear derailleur 30). For example, the first signal receiving portion 90 of the tester circuit 80 is configured to receive position sensor signals from the front derailleur 28.

The second signal receiving portion 92 is configured to receive signals from the signal transmitting portion 46 of the shift device 26. For example, the second signal receiving portion 92 is configured to receive signal patterns that corresponding to chain movement instructions from the shift device 26.

The second signal transmitting portion 93 is configured to transmit signals to the signal receiving portion 48 of the shift device 26. For example, the second signal transmitting portion 93 is configured to send position sensor signals to the shift device 26 to simulate a corresponding signal from one of the front derailleur 28 or the rear derailleur 30.

The switch mechanism 94 is a mechanical switching device that allows for user input. For example, the switching mechanism 94 can include a single switch that allows for choice of which component of the testing tool 14 is to be tested. Alternatively, the switch mechanism 94 can be a series of mechanical switches or a rotary dial(s) that allow for selection of a variety of testing and diagnostic functions. The switch mechanism 94 can also include a switch that causes the tester circuit 80 to begin testing the selected component of the electrically powered shift system 12.

The first voltage level conversion circuit 96 includes a voltage switch 106. The first voltage level conversion circuit 96 and the voltage switch 106 control voltage of incoming signals and transmitted outgoing signals. Specifically, the tester circuitry 80 of the testing tool 14 preferably operates at a voltage of 0.5 volts. Many electrically powered shift systems, such as the electrically powered shift system 12, for example, operate at a voltage of 1.0 volts. Therefore the first voltage level conversion circuit 96 and the voltage switch 106 are configured to reduce the voltage of incoming signals to protect the tester circuit 80. Further, the first voltage level conversion circuit 96 and the voltage switch 106 are configured to modify the voltage of outgoing signals from the tester circuit 80 to match the voltage of the signals transmitted and received by the components of the testing tool 14.

Similarly, the second voltage level conversion circuit 98 also includes a voltage switch 108. The second voltage level conversion circuit 98 and the voltage switch 108 control voltage of incoming signals and transmitted outgoing signals. Specifically, the second voltage level conversion circuit 98 and the voltage switch 108 are configured to reduce the voltage of incoming signals to protect the tester circuit 80. Further, the first voltage level conversion circuit 96 and the voltage switch 106 are configured to modify the voltage of outgoing signals from the tester circuit 80 to match the voltage of the signals transmitted and received by the components of the electrically powered shift system 12.

The audible indication portion 100 is configured to provide audible indications corresponding to the results of tests performed by the testing tool 14. For example, if the tests run by the testing tool 14 indicate a problem, a first noise or no noise is provided by the audible indication portion 100. If the tests run by the testing tool 14 indicate that there is no problem, a second noise is provided by the audible indication portion 100.

The visual indication portion 102 can include one or more LEDs or can include an LCD display (liquid crystal display). The visual indication portion 102 is configured to provide visible indications corresponding to the results of tests performed by the testing tool 14. For example, if the tests run by the testing tool 14 indicate a problem, a visual indication (for example, text or a light) can be provided by the visual indication portion 102. If the tests run by the testing tool 14 indicate that there is no problem, than a corresponding visual indication (text or a light) can be provided by the visual indication portion 102.

It should be understood from the description and the drawings herein that the testing tool 14 can be provided with both the audible indication portion 100 and the visual indication portion 102. Alternatively, the testing tool 14 can be provided with only one of the audible indication portion 100 and the visual indication portion 102 for economy.

Figure 10:
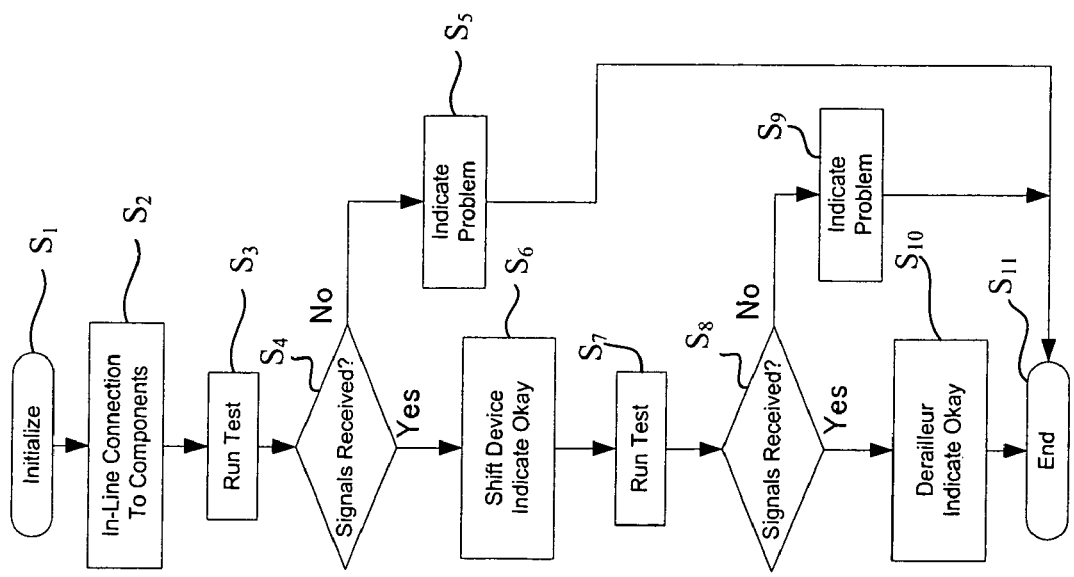
FIG. 10 is a flowchart outlining basic operational steps of the testing tool in accordance with the first embodiment the present invention.

Operation and function of the testing tool 14 is now provided with respect to the flowchart in FIG. 10. As indicated in the flowchart at step $S_1$, the testing tool 14 is first initialized.

In this step, a variety of events can occur. First, the user (a technician) turns the testing tool 14 on. Next, the user can select the desired test or tests to be performed using the switch mechanism 94. For example, in a first example test, the shift device 26, and the front derailleur 28 are to be tested for operability. The switch mechanism 94 is manipulated accordingly by the user so that the microcomputer 86 of the testing tool 14 accesses the appropriate signal patterns from the memory 104. Further, the appropriate voltage settings for the first and second voltage level conversion circuits 96 and 98 are selected by the user using the voltage switches 106 and 108.

Alternatively, the voltage level conversion circuits 96 and 98 can be provided with automatic voltage detection circuits and can automatically convert incoming signal voltage and transmitted outgoing signal voltage.

Next at step $S_2$, the connectors 76 and 78 of the wiring harness 34 are connected to the connectors 82 and 84 of the testing tool 14 by the user. Specifically, the connectors 76 and 78 shown in FIG. 3 and shown schematically in FIG. 6 are disconnected from one another. Then, as shown in FIG. 4, the connectors 76 and 78 are connected to the connectors 82 and 84. Connections between the connectors 76 and 78 and the connectors 82 and 84 are shown schematically in FIGS. 5 and 7.

Next at step $S_3$, the shift device 26 is manipulated by the user to initiate a movement of the chain 24. The testing tool 14 waits a predetermined amount of time for a signal pattern transmitted from the shift device 26 intended for the front derailleur 28 corresponding to a movement of the chain 24. At step $S_4$, a determination is made. Has the signal been received in a nominal time period? If not, operation moves to step $S_5$, where an indication of a problem is provided. The indication of a problem at step $S_5$, can be an audible sound from the audible indication portion 100 and a visual indication provided by the visual indication portion 102. Alternatively, only one of either an audible sound or a visual indication can be provided.

Returning to step $S_4$, if the appropriate signal has been transmitted from the shift device 26, then operation moves to step $S_6$, where an indication that no problem has been found is provided. The indication of no problem at step $S_6$, can be an audible sound from the audible indication portion 100 and a visual indication provided by the visual indication portion 102. Alternatively, only one of either an audible sound or a visual indication can be provided.

Next, at step $S_7$, the testing tool 14 transmits a simulated signal to the front derailleur 28 corresponding to a movement of the chain 24. The testing tool 14 waits a predetermined length of time for a corresponding change in the signal pattern from the position sensor 58 in the front derailleur 28. Change in the signal pattern from the position sensor 58 indicates that the motor control unit 56 has moved the chain 24 to the desired chainring and provided the desired change in gear ratio.

At step $S_8$, a determination is made. Specifically, if the appropriate signal pattern has not been received from the front derailleur 28 indicating appropriate movement of the chain 24, then operation moves to step $S_9$, where an indication of a problem is provided. The indication of a problem at step $S_9$ can be an audible sound from the audible indication portion 100 and a visual indication provided by the visual indication portion 102. Alternatively, only one of either an audible sound or a visual indication can be provided.

Returning to step $S_8$, if the appropriate signal pattern has been received from the front derailleur 28 indicating appropriate movement of the chain 24, then operation moves to step $S_{10}$, where an indication that no problem has been found is provided. The indication of no problem at step $S_{10}$, can be an audible sound from the audible indication portion 100 and a visual indication provided by the visual indication portion 102. Alternatively, only one of either an audible sound or a visual indication can be provided.

The process ends at step $S_{11}$. The process can be repeated using the same steps and procedures depicted in FIG. 10 and described above to test and diagnose the rear derailleur 30. Since the steps are the same, description is omitted for the sake of brevity.

Second Embodiment

Figure 11:
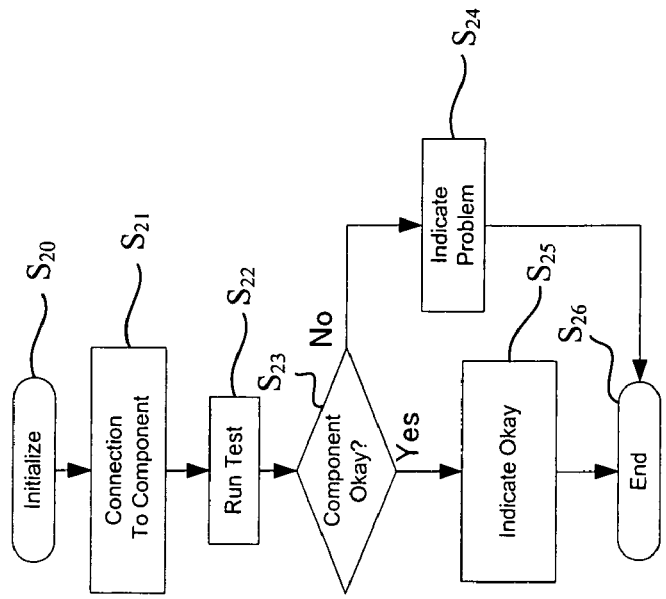
FIG. 11 is a flowchart outlining basic operational steps of the testing tool in accordance with the second embodiment the present invention.

Referring now to FIG. 11, a flowchart in accordance with a second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

In the second embodiment, the testing tool 14 is connected directly to and tests only one of the components of the electrically powered shift system 12 at a time. Specifically, the testing tool 14 tests only one of the shift device 26, the front derailleur 28 or the rear derailleur 30. In the second embodiment, the testing tool 14 is capable of testing all three of the shift device 26, the front derailleur 28 and the rear derailleur 30. However, only one component can be tested during a single test.

As shown in FIG. 11 at step $S_{20}$, the testing tool 14 is first initialized. In this step, a variety of events can occur. First, the user (a technician) turns the testing tool 14 on. Next, the user selects the component to be tested using the switch mechanism 94. For example, in a first example test, the front derailleur is to be tested for operability. The switch mechanism 94 is manipulated accordingly by the user so that the microcomputer 86 of the testing tool 14 accesses the appropriate signal patterns from the memory 104. Further, the appropriate voltage settings for the first and second voltage level conversion circuits 96 and 98 are selected by the user using the voltage switches 106 and 108.

Alternatively, the voltage level conversion circuits 96 and 98 can be provided with automatic voltage detection circuits and can automatically convert incoming signal voltage and transmitted outgoing signal voltage.

Next at step $S_{21}$, the connector 76 is connected to the connector 82 of the testing tool 14 by the user, as shown schematically in FIG. 8.

Next at step $S_{22}$, the testing tool 14 transmits a simulated signal to the front derailleur 28 corresponding to a movement of chain 24. The testing tool 14 waits a predetermined length of time for a corresponding change in the signal pattern from the position sensor 58 in the front derailleur 28. Change in the signal pattern from the position sensor 58 indicates that the motor control unit 56 has moved the chain 24 to the desired chainring location and provided the desired change in gear ratio.

At step $S_{23}$, a determination is made. Specifically, if the appropriate signal pattern has not been received from the front derailleur 28 indicating appropriate movement of the chain 24, then operation moves to step $S_{24}$, where an indication of a problem is provided. The indication of a problem at step $S_{24}$ can be an audible sound from the audible indication portion 100 and a visual indication provided by the visual indication portion 102. Alternatively, only one of either an audible sound or a visual indication can be provided.

Returning to step $S_{23}$, if the appropriate signal pattern has been received from the front derailleur 28 indicating appropriate movement of the chain 24, then operation moves to step $S_{25}$, where an indication that no problem has been found is provided. The indication of no problem at step $S_{25}$, can be an audible sound from the audible indication portion 100 and a visual indication provided by the visual indication portion 102. Alternatively, only one of either an audible sound or a visual indication can be provided.

The process ends at step $S_{26}$. The process can be repeated using the same steps and procedures depicted in FIG. 11 and described above to test and diagnose the rear derailleur 30. The steps are the same, except that the rear derailleur 30 is connected to the testing tool 14 as shown schematically FIG. 9. Otherwise, operations are the same. Therefore, description is omitted for the sake of brevity.

In order for the testing tool 14 to test the shift device 26 the steps outlined in FIG. 11 are also followed. However, in order to test the shift device 26, the user must select the shift device 26 for testing in step $S_{20}$. Further, in step $S_{22}$, the testing tool 14 waits a predetermined period of time for transmission of signal patterns from the shift device 26 indicating desired chain movement. Otherwise, operation of the testing tool 14 is the same as described above.

GENERAL INTERPRETATION OF TERMS

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of a bicycle equipped with the present invention. Accordingly, these terms, as utilized to describe the present invention should be interpreted relative to a bicycle equipped with the present invention as used in the normal riding position. Finally, terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A testing tool for electric bicycle devices comprising:
a tester circuit configured and arranged to check operability of at least one electric bicycle device that includes an electric shift operating device, the tester circuit including a signal transmitting portion configured to transmit at least one simulated position sensor signal to the electric shift operating device, a signal receiving portion configured to receive shift instruction signals from the electric shift operating device, and an indication portion configured to provide an indication representing the operability of the electric shift operating device as checked by the tester circuit based on the at least one simulated position sensor signal and the shift instruction signals; and
a connector extending from the tester circuit, configured and arranged to connect to the electric bicycle device and provide electronic communications between the electric bicycle device and at least one of the signal receiving portion and the signal transmitting portion of the tester circuit.

2. A testing tool for electric bicycle devices comprising:
a tester circuit configured and arranged to check operability of an electric bicycle device that includes at least one of an electric front derailleur and an electric rear derailleur, the tester circuit including a signal transmitting portion configured to transmit an output signal to at least one of the electric front derailleur and the electric rear derailleur, a signal receiving portion configured to receive an input signal from at least one of the electric front derailleur and the electric rear derailleur, and an indication portion configured to provide an indication representing the operability of at least one of the electric front derailleur and the electric rear derailleur as checked by the tester circuit based on the input and output signals; and
a connector extending from the tester circuit, configured and arranged to connect to the electric bicycle device and provide electronic communications between the electric bicycle device and at least one of the signal receiving portion and the signal transmitting portion of the tester circuit.

3. The testing tool for electric bicycle devices as set forth in claim 2, wherein
the signal transmitting portion is configured to send at least one chain movement signal as the output signal to the at least one of the electric front derailleur and the electric rear derailleur, and the signal receiving portion is configured to receive as the input signal position sensor signals from the at least one of the electric front derailleur and the electric rear derailleur corresponding to chain guide position.

4. The testing tool for electric bicycle devices as set forth in claim 1, wherein
the tester circuit includes a switch for selecting the electric shift operating device for testing.

5. The testing tool for electric bicycle devices as set forth in claim 1, wherein
the tester circuit includes a voltage level conversion switching circuit configured to protect the tester circuit from a voltage differential in the electric bicycle device.

6. The testing tool for electric bicycle devices as set forth in claim 1, wherein
the indication portion of the tester circuit includes a visual display configured to indicate a tested status of the electric bicycle device.

7. The testing tool for electric bicycle devices as set forth in claim 1, wherein
the indication portion of the tester circuit includes an audio device configured to indicate a tested status of the electric bicycle device.

8. The testing tool for electric bicycle devices as set forth in claim 1, wherein
the tester circuit includes memory having stored output signal patterns corresponding to output signal patterns of a plurality of electric bicycle devices.

9. The testing tool for electric bicycle devices as set forth in claim 8, wherein
the memory has stored input signal patterns corresponding to input signal patterns recognized by a plurality of electric bicycle devices.

10. A testing tool for electric bicycle devices comprising:
a tester circuit configured and arranged to check operability of at least one electric bicycle device, the at least one electric bicycle device including an electric shift operating device and at least one of an electric front derailleur and an electric rear derailleur;
a first connector extending from the tester circuit, configured and arranged to connect to the electric shift operating device and provide electronic communications between the tester circuit and the electric shift operating device;
a second connector extending from the tester circuit, configured and arranged to connect to one of the electric front derailleur and the electric rear derailleur and provide electronic communications between the one of the electric front derailleur and the electric rear derailleur and the tester circuit; and
an indication portion configured to provide an indication representing the operability of the at least one electric bicycle device as checked by the tester circuit.

11. A testing tool for electric bicycle devices comprising:
a tester circuit configured and arranged to check operability of at least one electric bicycle device that includes at least one of an electric front derailleur and an electric rear derailleur, the tester circuit including a signal transmitting portion and a signal receiving portion configured for communication with the at least one of the electric front derailleur and the electric rear derailleur, with the signal transmitting portion being configured to send at least one chain movement signal to the at least one of the electric front derailleur and the electric rear derailleur, and the signal receiving portion being configured to receive position sensor signals from the at least one of the electric front derailleur and the electric rear derailleur corresponding to chain guide position; and
a connector extending from the tester circuit, configured and arranged to connect to the electric bicycle device and provide electronic communications between the tester circuit and the electric bicycle device.

12. The testing tool for electric bicycle devices as set forth in claim 2, wherein
the tester circuit includes a switch for selecting one of the electric front derailleur and the electric rear derailleur for testing.

13. The testing tool for electric bicycle devices as set forth in claim 2, wherein
the tester circuit includes a voltage level conversion switching circuit configured to protect the tester circuit from a voltage differential in the electric bicycle device.

14. The testing tool for electric bicycle devices as set forth in claim 2, wherein the indication portion of the tester circuit includes a visual display configured to indicate a tested status of the electric bicycle device.

15. The testing tool for electric bicycle devices as set forth in claim 2, wherein
the indication portion of the tester circuit includes an audio device configured to indicate a tested status of the electric bicycle device.

16. The testing tool for electric bicycle devices as set forth in claim 2, wherein
the tester circuit includes memory having stored output signal patterns corresponding to output signal patterns of a plurality of electric bicycle devices.

17. The testing tool for electric bicycle devices as set forth in claim 16, wherein
the memory has stored input signal patterns corresponding to input signal patterns recognized by a plurality of electric bicycle devices.

* * * * *